(12) United States Patent
Kosaki et al.

(10) Patent No.: US 6,335,265 B1
(45) Date of Patent: Jan. 1, 2002

(54) METHOD FOR MANUFACTURING SEMICONDUCTOR DEVICE AND SEMICONDUCTOR DEVICE

(75) Inventors: Katsuya Kosaki; Hirofumi Nakano; Tetsuo Kunii, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/447,289

(22) Filed: Nov. 23, 1999

(30) Foreign Application Priority Data

May 18, 1999 (JP) .......................................... P11-137124

(51) Int. Cl.⁷ .............................................. H01L 21/78
(52) U.S. Cl. ........................ 438/462; 438/114; 438/464; 438/465
(58) Field of Search .................. 438/113, 114, 438/460, 462, 464, 465; 257/620, 712, 713, 720

(56) References Cited

U.S. PATENT DOCUMENTS

| | | | | |
|---|---|---|---|---|
| 5,275,958 A | * | 1/1994 | Ishikawa | .................... 438/462 |
| 5,302,554 A | * | 4/1994 | Kashiwa et al. | ............... 438/17 |
| 5,872,396 A | * | 2/1999 | Kosaki | ........................ 257/712 |
| 5,998,238 A | * | 12/1999 | Kosaki | ........................ 438/114 |
| 6,008,537 A | | 12/1999 | Kosaki et al. | ............... 257/712 |
| 6,157,077 A | * | 5/2000 | Matsuoka et al. | ........... 257/706 |
| 6,136,668 A | * | 10/2000 | Tamaki et al. | .............. 438/462 |
| 6,245,596 B1 | * | 6/2001 | Kosaki et al. | ............... 438/114 |

FOREIGN PATENT DOCUMENTS

| | | | |
|---|---|---|---|
| JP | 2-253642 | * | 10/1990 |
| JP | 2-260443 | * | 10/1990 |
| JP | 6-112236 | * | 4/1994 |
| JP | 8-264491 | * | 10/1996 |

* cited by examiner

Primary Examiner—Olik Chaudhuri
Assistant Examiner—Alonzo Chambliss
(74) Attorney, Agent, or Firm—Leydig, Voit, & Mayer, Ltd.

(57) ABSTRACT

A semiconductor device has a plated heat sink layer on the back surface, preventing a short-circuit between a bonding wire and a first metal layer. A method of making a semiconductor device includes forming a catalyst layer on a bottom of a first separation groove in the front surface of a semiconductor substrate, forming a first metal layer selectively in the first separation groove by electroless plating, using the catalyst layer as a catalyst.

5 Claims, 9 Drawing Sheets

METHOD FOR MANUFACTURING SEMICONDUCTOR DEVICE AND SEMICONDUCTOR DEVICE

BACKGROUND OF THE INVENTION

The present invention relates to a method for manufacturing a semiconductor device and the semiconductor device manufactured by the method, in which the semiconductor device is manufactured by using a laser-cutting a plate having a number of such semiconductor devices.

Typically, a microwave high power device such as GaAs high power FET, including a semiconductor element, includes a thinned semiconductor substrate having a small thickness of about 30 μm for an effective radiation of heat generated at a semiconductor element. Also, for further heat radiation, a radiation metal layer (PHS layer) is provided on one surface of the semiconductor substrate away from the semiconductor element.

PCT/WO98/13862 discloses a method for manufacturing a GaAs high power semiconductor device having such heat radiation metal layer, which is illustrated in FIGS. 5A to 5L. According to the method, as shown in FIG. 5A, a first main surface of GaAs substrate 31 carrying semiconductor elements is etched to form a first separation groove 33, in which a photoresist layer 32 provided on the first main surface is used as a mask. Then, as shown in FIG. 5B, the first separation groove 33 is plated with a first metal layer 34. As shown in FIG. 5C, the GaAs substrate 31 then has wax 35 applied on the first main surface and is further bonded onto a supporting wafer 36 made of glass or sapphire. Also, the GaAs substrate 31 is polished at its second main surface to reduce its thickness to about 20 to 30 μm. Subsequently, as shown in FIG. 5D, the GaAs substrate 31 is provided at its second main surface with a photoresist layer 44 which is then patterned with an aperture opposing the first separation groove 33. The photoresist layer 44 so patterned is used as a mask for an etching in which the second main surface of the GaAs substrate 31 is etched to the extent that the bottom surface of the first metal layer 34 in the first separation groove 33 is exposed, which results in a second separation groove 63 shown in FIG. 5E.

Next, as shown in FIG. 5F, the photoresist layer 44 is removed and then a conducting layer 37 is plated on the entire second main surface of the GaAs substrate 31. Further, as shown in FIG. 5G, a photoresist 45 is provided on the conducting layer 37 which is used for a mask in the subsequent plating of a second metal layer 46 made of the same metal as that of the first metal layer 34. Afterwards, as shown in FIG. 5H, a photoresist layer 47 having a width smaller than that of the second separation groove 63 is formed in the second separation groove 63. With the photoresist layer 47 as a mask, a PHS layer 38 is formed on the second main surface of the GaAs substrate 31 by the electroplating. Next, as shown in FIG. 5I, the GaAs substrate 31 is removed from the supporting wafer 36. In addition, as shown in FIG. 5J, an expandable film 40 is attached on the PHS layer 38. Then, the first and second metal layers, 34 and 46, are grooved and then separated from the first separation groove 33 by exposure to laser light such as YAG laser light as illustrated by the dotted line. This results in a semiconductor device shown in FIG. 5K. Finally, as shown in FIG. 5L, the semiconductor device is bonded at its bottom with a package 39 and is provided at its top with bonding wires 40 by a wirebonding technique, and then sealed in a ceramic package or a metal package not shown.

Generally, in the semiconductor device so manufactured, the topmost of the first metal layer 34 extends to a level of the first main surface of the GaAs substrate 31. Disadvantageously, the topmost of the first metal layer 34 can extend above the first main surface of the GaAs substrate 31 because the first metal layer is formed by the plating as described above. This may cause the bonding wire 40 to make an unwanted short-circuit with the first metal layer 34, which results in a reduction of yield rate of the device.

SUMMARY OF THE INVENTION

Therefore, an object of the present invention is to provide a method of manufacturing a semiconductor device in which no short-circuit would occur between the bonding wires and the first metal layer. Another object of the present invention is to provide a semiconductor device manufacture by the method.

Hence, the inventors of the present invention have intensively studied. As a result, the present inventors have found that the first metal layer is selectively formed in the first separation groove by an electroless plating technique using catalyst layer formed on the bottom of the first separation groove as a catalyst, so that the topmost of the first metal layer is located below that of the opening of the first separation groove, which ensures that no short circuit would occur between the bonding wire and the first metal layer, thereby accomplishing the present invention.

The present invention provides a method for manufacturing a semiconductor device, including the steps of: providing a substrate having first and second main surfaces and having a semiconductor element formed in the first main surface; forming a first groove in the first main surface of the substrate, the first groove having a bottom surface with a width and opposing side surfaces on the bottom surface; forming selectively a catalyst layer on the bottom surface of the first groove, the catalyst layer containing palladium in an upper surface thereof; forming a fist metal layer of a nickel based plating layer on the upper surface of the catalyst layer by an electroless plating technique, a top portion of the first metal layer located at a distance below a top end of the side surface of the first groove; forming a second groove in the second main surface of the substrate along the first groove, the second groove having a bottom with a smaller width than that of the bottom of the first groove and opposing side surfaces on the bottom surface, the bottom surface of the second groove being a backside surface of the catalyst layer; forming a second metal layer overlying the bottom and side surfaces of the second groove; and laser-cutting the first metal layer, the catalyst layer, and the second metal layer through the first groove.

By using such a method, the first metal layer can be formed selectively in the first separation groove so that the topmost of the first metal layer is located below that of the opening of the first separation groove, which ensures that no short circuit would occur between the bonding wire and the first metal layer.

Also, the catalyst layer containing palladium (Pd) is formed by a dry-processing technique, thereby deposition of palladium ion on outside of the first separation groove and forming nickel based plating layer on the portion where the palladium ion is deposited can be prevented.

Also, a deposit formed by reacting palladium ion and oxygen or the like can be prevented from forming on the bottom of the first separation groove.

After the step of forming the first metal layer, the method may further comprise the step of attaching a supporting member on the first main surface, and thinning the substrate through the second main surface.

Preferably, the step of forming the catalyst layer containing the steps of: forming a first photoresist layer on the first surface of the substrate, the photoresist layer having an opening opposing to the first groove; depositing a catalyst material on the bottom surface of the first groove through the first photoresist layer as a mask by evaporation or sputtering deposition; and removing the first photoresist layer together with the catalyst material on the photoresist layer, and remaining the catalyst material on the bottom surface of the first groove.

By using this step, the catalyst layer is formed selectively only on the bottom of the first separation groove.

By forming the nickel based plating layer using the palladium in the catalyst layer as a catalyst, the nickel based plating layer can be selectively formed only near the catalyst layer.

The catalyst layer preferably has two-layers of a palladium layer and a titanium layer under the palladium layer, or a single palladium layer.

The nickel based plating layer is preferably made of one material selected from Ni—P alloy, Ni—B alloy, and Ni—B—W alloy.

The present invention provides a semiconductor device, comprising: a semiconductor substrate having first and second main surfaces, having a semiconductor element formed in the first main surface and having a peripheral surface containing the first and second main surface; a heat radiation layer provided on the second main surface of the semiconductor substrate; and a flange of a plurality of metal layers disposed on the peripheral surface of the substrate, the metal layers comprising; a first metal layer having a surface layer containing palladium on the same side with the first main surface, a second metal layer of nickel based alloy disposed on the surface layer containing palladium of the first metal layer, and the second metal layer having a top portion located at a distance below the first main surface, and a third metal layer disposed under the first metal layer.

The metal layer provided on the peripheral surface of the substrate is formed away from the front surface of the semiconductor substrate, thereby the short circuit between the bonding wire and the metal layer can be prevented at the wirebonding of the semiconductor substrate.

The third metal layer may comprise a nickel based alloy layer, a gold layer and a laser-cut metal layer including a nickel layer or a chromium layer.

The third metal layer may further comprise a single layer of gold or a plurality of layers including a titanium layer and a gold layer on the laser-cut metal layer.

The wettability of the lower surface of the PHS layer against an AuSn solder used for bonding the lower surface of the PHS layer onto the package is improved.

The first metal layer preferably comprise two-layers of a palladium layer and a titanium layer under the palladium layer, or a single layer.

The second metal layer is preferably made of one material selected from Ni—P alloy, Ni—B alloy, and Ni—B—W alloy.

As will be clear from the above description, in the semiconductor device manufactured by the method of the present invention, the topmost of the first metal layer is located below the upper surface of the GaAs substrate, therefore the short circuit between the bondingwire and the first metal layer can be prevented, and the production yield of the semiconductor device can be increased.

Also, according to the method of the present invention, the catalyst layer including palladium is formed by dry-processing, therefore a deposit is not formed on the bottom of the first separation groove. Thereby the unevenness of the laser-cut layer, which makes defects in the laser cutting, is prevented and the yield of the semiconductor device can be increased.

Also, the nickel based plating layer is formed by using the catalyst layer as a catalyst, thereby the nickel based plating layer is prevented from forming on the outside of the first separation groove and the production yield can be increased.

DESCRIPTION OF THE PREFERRED EMBODIMENTS

I. FIRST EMBODIMENT

Referring to FIGS. 1A to 1K, a method for manufacturing a semiconductor device and a semiconductor device manufactured by the method according to the present invention will be described hereinafter.

Figure 1A:
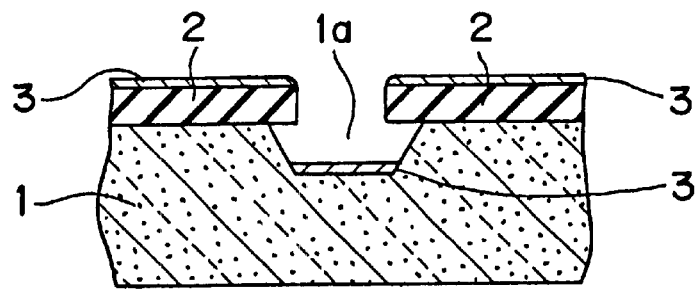
FIGS. 1A–1K show manufacturing processes for a semiconductor device according to the first embodiment of the present invention.

According to the method, as best shown in FIG. 1A, provided is a GaAs substrate 1 having a semiconductor element in its first main surface. The GaAs substrate 1 is provided on the first main surface with a photoresist layer 2. The layer 2 is used as a mask in a subsequent wet etching process in which the GaAs substrate 1 is etched to form a first separation groove (a surface separation groove) 1a. Then, a catalyst layer 3 including palladium (Pd) is deposited on an entire surface of the remaining photoresist layer 2 by a suitable film forming technique such as evaporation and sputtering deposition. In this film formation, a part of the catalyst layer 3 is formed on a surface of the first separation groove 1a.

The palladium included in the catalyst layer 3 exists in a considerably stable state so that it never elutes out of the catalyst layer 3 to result in an unwanted separation of the catalyst layer 3 in a subsequent formation of the second separation layer 1b (see FIG. 1I), which would otherwise be caused if the eluted palladium forms an oxide between the catalyst layer 3 and the GaAs substrate 1.

It should be noted that the possible separation of the catalyst layer 3 will result in an unevenness in thickness of a metal layer 10 to be formed on the bottom surface of the catalyst layer 3 and then cut by an exposure to laser light. Also, the unevenness can make defects in the laser cutting in a separation process of the semiconductor devices (see FIG. 1K), which decreases the yield of the semiconductor device. Contrary to this, the catalyst layer 3 so formed will increase the yield of the device.

Figure 1B:
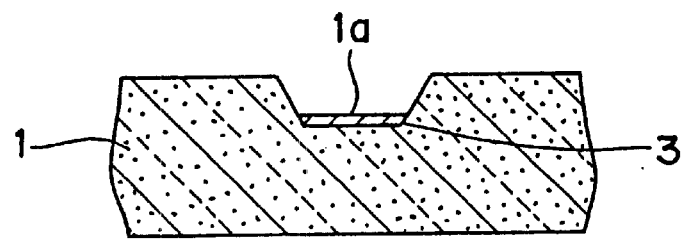

Referring next to FIG. 1B, the catalyst layer 3 on the photoresist layer 2 is removed using a lift off method except in the first separation groove 1a.

It should be noted that the catalyst layer 3 is a single layer made of palladium, having a thickness of about 10 nm. Preferably, the thickness of the palladium layer is in the range of about 5 to 30 nm. Alternatively, the catalyst layer 3 may be made from layers of palladium and titanium. In this instance, the palladium layer should overlie the titanium layer so that the catalyst layer 3 serves as a catalyst.

Figure 1C:
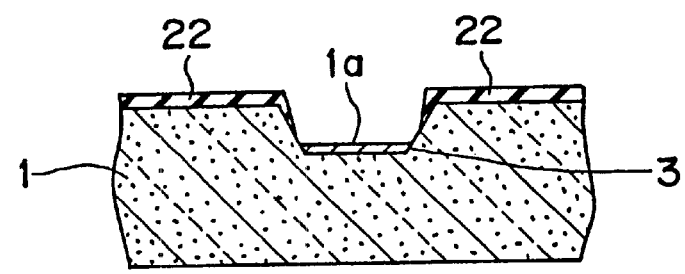

Referring next to FIG. 1C, a photoresist layer 22 is formed on the substrate 1 so that it does not cover the first separation groove 1a. As can be seen from the drawing, edges of the photoresist layer 22 extend slightly into the first separation groove 1a, so that slanted side surfaces defining a part of the first separation groove 1a are half (about 50%) covered by the photoresist 22.

Figure 1D:
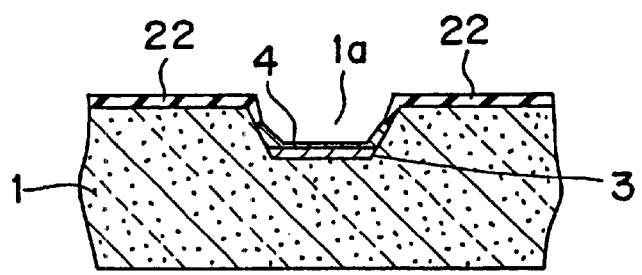

Also, the GaAs substrate 1 is dipped in a nickel (Ni) based electroless plating solution (not shown), for example, Ni—P plating solution. This step assures, as shown in FIG. 1D, a nickel plating layer 4 is formed only in the first separation groove 1a.

In this nickel based electroless plating, atomic hydrogen serving as catalyst of a reducing reaction and molecular hydrogen giving a stirring effect, generated in the plating reaction, improve the formation of the plating film.

It should be understood that the plating is represented by the following equations:

  Equation 1
  Equation 2
  Equation 3
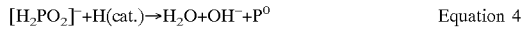  Equation 4
  Equation 5

This means that, in the first separation groove 1a, a hypophosphorous acid ion in the plating solution is dissolved as indicated by the equation 1 using palladium contained in the catalyst layer 3 as a catalyst. This supplies enough atomic hydrogen to the side walls of the first separation groove 1a. At the side walls of the first separation groove 1a, an electron is carried away from nickel ion in the side wall, so that the nickel ion is reduced as shown by the equation 3, whereby nickel is deposited. Phosphorus (P) is also deposited from hypophosphorous acid ion as indicated by the equation 4. Thereby, a nickel based plating layer 4 (a Ni—P alloy plating layer) is formed on the bottom of the first separation groove 1a. Further, some atomic hydrogen is supplied to portions of the side walls of the first separation groove 1a, away from the catalyst layer 3. This results in, as shown in FIG. 1D, the nickel based plating layer 4 being formed so that it extends from the surface of the catalyst layer 3 onto the side walls.

On the other hand, the second main surface and a peripheral surface of the GaAs substrate 1 are far away from the catalyst layer 3 which is a source of the atomic hydrogen, so that hydrogen is not supplied to the surfaces. Therefore, no plating layer is formed on the second main surface or the peripheral surface of the GaAs substrate 1. This means that, by using this method, the nickel based plating layer 4 can be formed selectively only near the catalyst layer 3 to which the atomic hydrogen can be supplied. This in turn allows the topmost of the nickel based plating layer 4 to be located below that of the opening of the first separation groove 1a, which ensures that no short circuit would occur between the plating layer 4 and the bonding wire at the wirebonding of the GaAs substrate 1.

Furthermore, although the nickel based plating layer 4 is formed using the catalyst layer 3, it may be provided only by electroless plating. In this instance, the GaAs substrate 1 must be dipped in a solution containing phosphorus before the electroless plating in order to form a catalyst nucleus in the first separation groove 1a. This plating may have some drawbacks.

Specifically, phosphorus ion may deposit on a portion on which the nickel based plating layer should not be formed, for example, the upper surface of the photoresist layer and the second main surface of the GaAs substrate 1. This undesired deposition may result in the nickel based plating layer being formed on the second main surface of the GaAs substrate 1 in the electroless plating.

Also, the nickel based plating layer grown on the photoresist layer disadvantageously may in part separate into a solvent in a process for removing the photoresist (see FIG. 1E), so the separated plating layer adheres again to the surface of the GaAs substrate 1 in the subsequent processes, which provides an adverse effect.

Further, the nickel based plating layer formed on the second main surface of the GaAs substrate 1 may result in a variation of the etching of the second main surface of the GaAs substrate 1 in a thinning process of the GaAs substrate 1 (FIG. 1F), causing an unevenness in thickness of the etched GaAs substrate 1. In addition, the nickel based plating layer formed on the peripheral surface of the GaAs substrate 1 may result in a binding in a polishing blade at the thinning process, which may crack or damage the GaAs substrate.

Figure 1E:
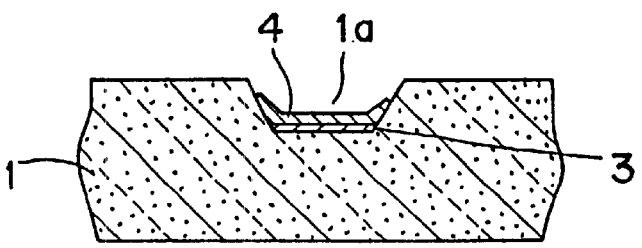

Subsequent to the above mentioned processes, as shown in FIG. 1E, the photoresist layer 22 is removed using an organic solvent or the like.

Figure 1F:
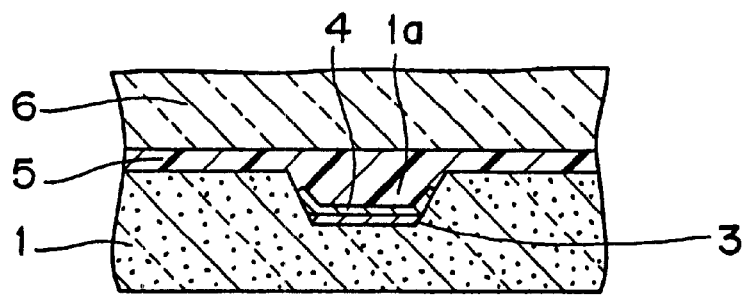
Figure 1G:
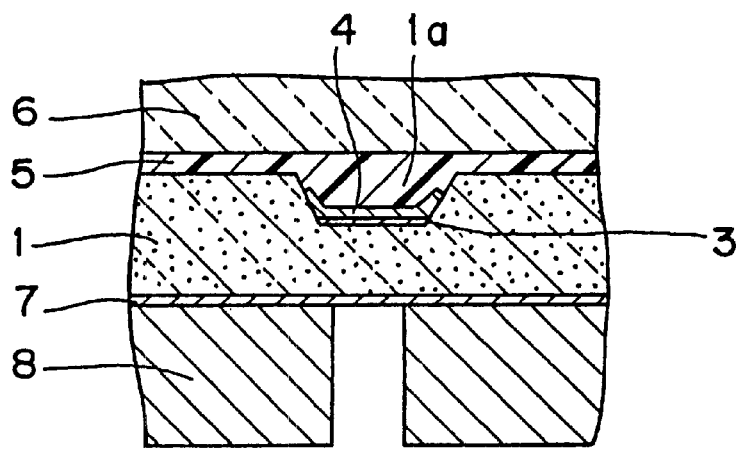

Next, as shown in FIG. 1F, the first main surface of the GaAs substrate 1 is coated with a wax 5 as an adhesive through which a supporting wafer 6 is bonded on the substrate 1. The supporting wafer 6 is a plate made of suitable material such as glass and sapphire. Then, the GaAs substrate 1 is thinned from its second main surface to about 20 to 30 $\mu$m. The thinning may be accomplished by any suitable manner such as grinding, lapping, and polishing.

Figure 2A:
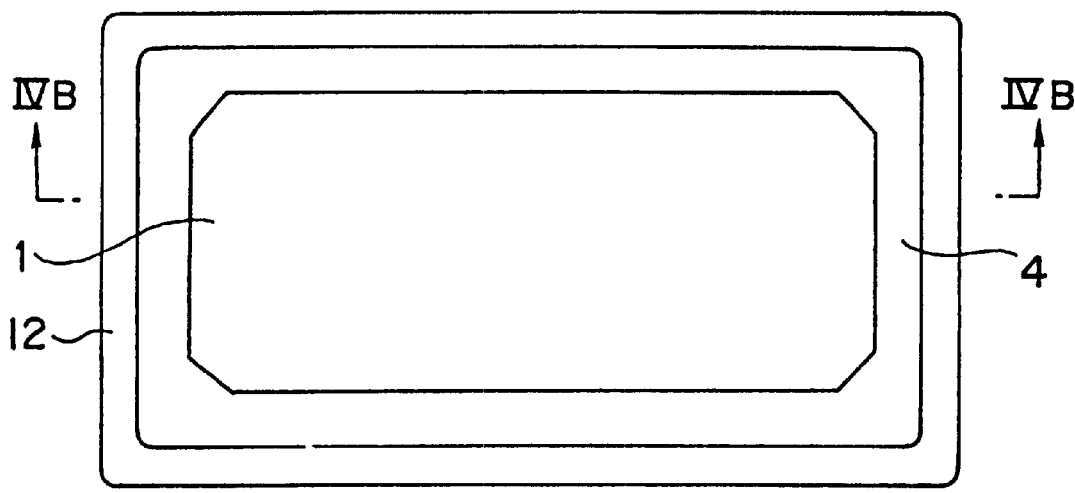
FIGS. 2A–2B show manufacturing processes for the semiconductor device according to the first embodiment of the present invention.
Figure 2B:
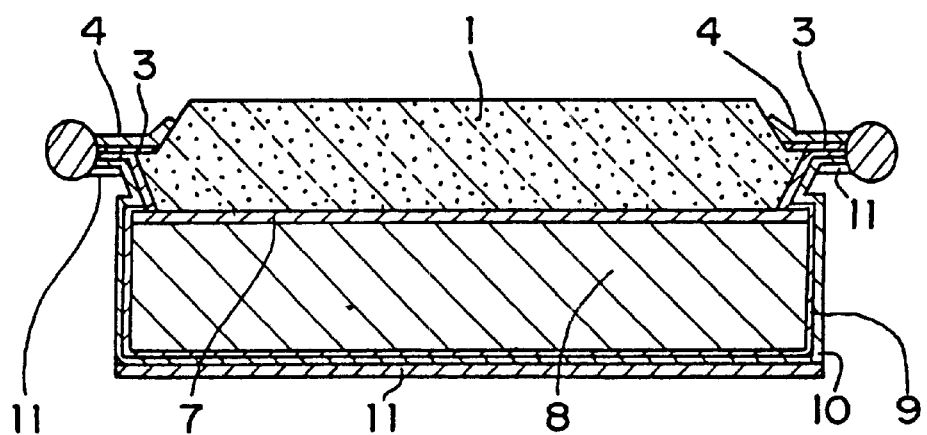

Next, as shown in FIG. 2G, the entire second main surface of the GaAs substrate 1 is coated with a first conducting layer 7. The conducting layer 7 may be formed by, for example, forming a nickel based plating layer on the first main surface of the GaAs substrate 1, and substituting the upper surface of the plating layer for gold (Au). Then, a part of the second main surface of the GaAs substrate 1, opposing the first separation groove 1a, is formed with a photoresist layer (not shown). Preferably, a width of the photoresist layer is smaller than that of the groove 1a. The photoresist layer is used as a mask in an electrolytic process in which a PHS layer 8 made from gold is formed on the conducting layer 7. Then, the photoresist layer is removed.

Figure 1H:
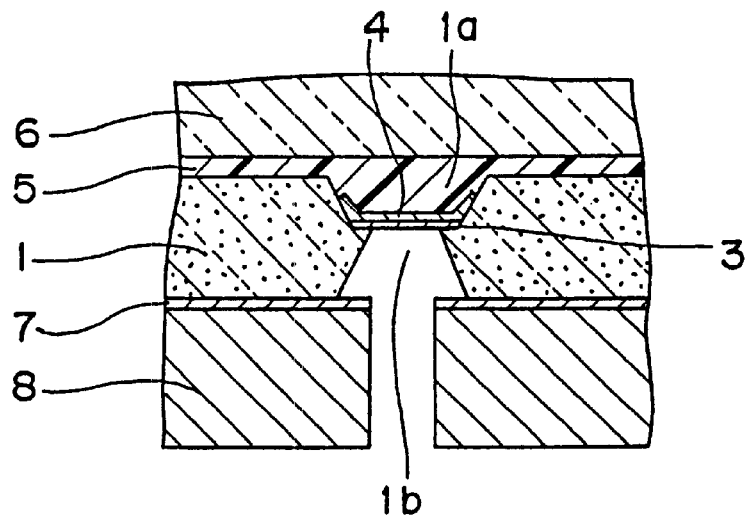

As shown in FIG. 1H, the PHS layer 8 serves as a mask in an etching process in which a portion of the conducting layer 7 adjacent to the groove 1a is removed. This etching process is extended to the lower surface of the catalyst layer 3 to form a second separation groove 1b.

Figure 1I:
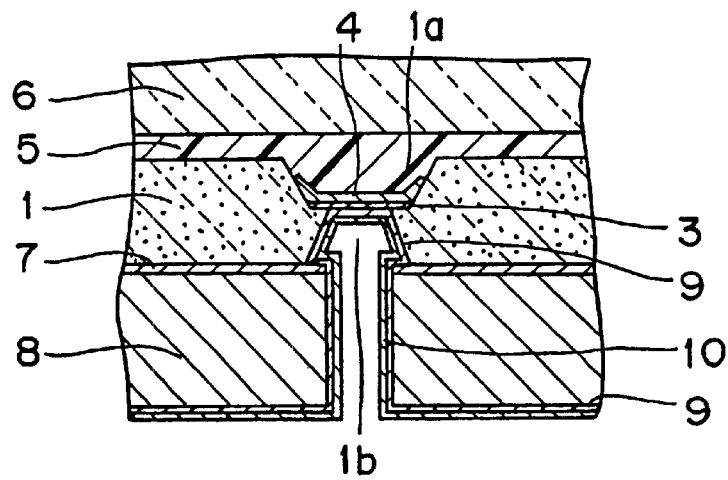

Next, as shown in FIG. 1I, a second conducting layer 9 is formed on surfaces of the second separation groove 1b and the PHS layer 8 by electroless plating, similar to the first conducting layer 7. The process for forming the second conducting layer 9 may be the same as that for the first conducting layer 7. Further, a metal layer 10 is formed on the second conducting layer 9 by the electroplating process. Preferably, the metal layer 10 is made of metal having a melting point higher than that of the nickel based plating layer 4 in the first separation groove 1a and having a reflection ratio of less than 8% of YAG laser light. Also preferably, the nickel based plating layer 4 is made from nickel based alloy selected from materials such as Ni—P, Ni—B and Ni—B—W, and the metal layer 10 is made of material such as nickel and chromium.

Figure 1J:
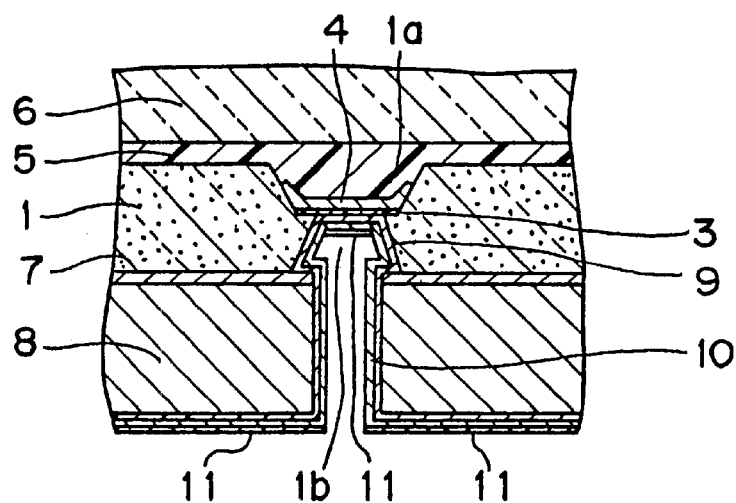

Referring to FIG. 1J, the entire surfaces of the metal layer 10 and the second separation groove 1b are covered by a titanium (Ti) layer about 0.05 μm in thickness and then a gold (Au) layer about 0.2~0.3 μm in thickness by a suitable film formation technique such as sputtering deposition and evaporation, forming a Ti/Au layer 11.

It should be noted that the Ti/Au layer 11, which improves wettability of the lower surface of the PHS layer 8 against an AuSn solder used for bonding the lower surface of the PHS layer 8 onto the package, can be removed therefrom.

Figure 1K:
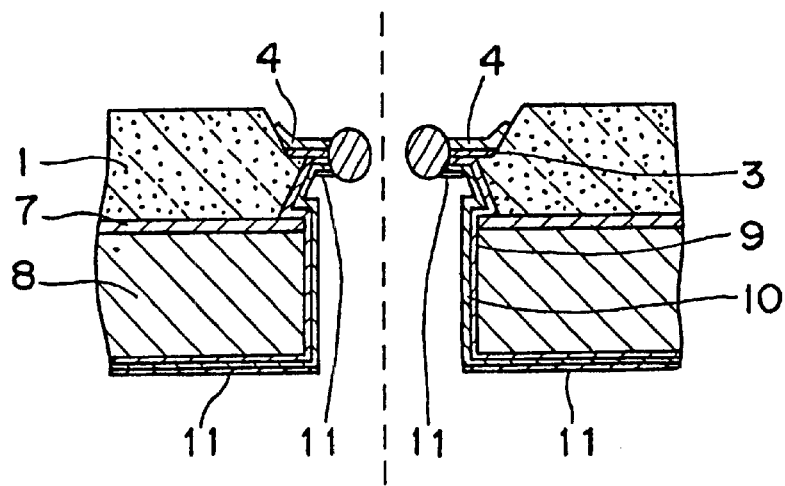

Finally, referring to FIG. 1K, the GaAs substrate 1 is removed from the supporting wafer 6. Also, the wax 5 is removed using an organic solvent. Further, an expandable film (not shown) is attached on the PHS layer 8 on the second main surface (back side) of the GaAs substrate 1. Then, the YAG laser beam is irradiated from above, toward the first separation groove 1a to heat-cut the nickel based plating layer 4, the catalyst layer 3, the second conducting layer 9 having the nickel plating layer and the gold layer, the metal layer 10, and the Ti/Au layer 11 (as shown by a dotted line in FIG. 1K). It should be noted that the expandable film remains uncut, and is expanded in all directions by a suitable expander to separate each element so manufactured from one another. In this way, the GaAs substrate 1 is separated into pieces, each of which forms an independent semiconductor element having the separated piece of the GaAs substrate 1. An example of the semiconductor element or device so manufactured is illustrated in FIGS. 4A and 4B.

Figure 5A:
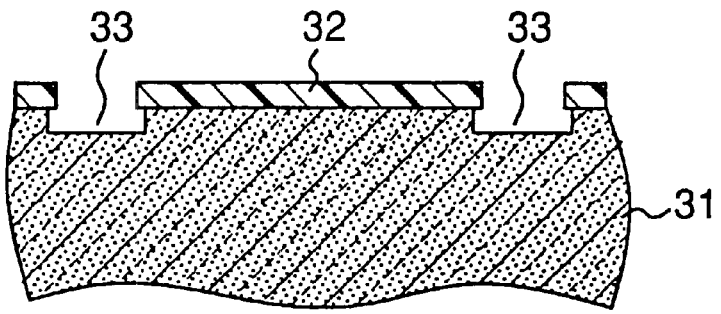
FIGS. 5I–5L show manufacturing processes for the prior art semiconductor device.
Figure 5B:
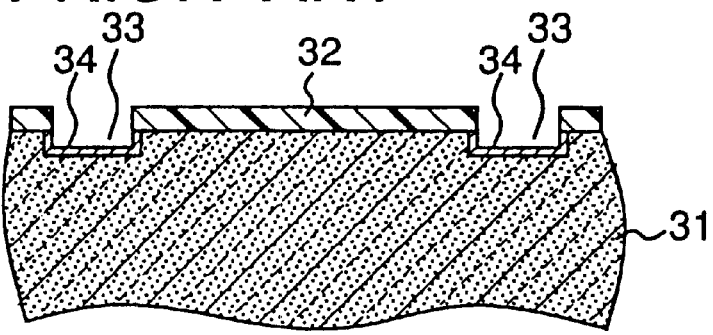
Figure 5C:
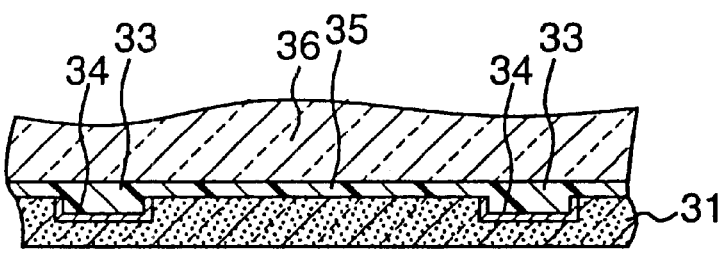
Figure 5D:
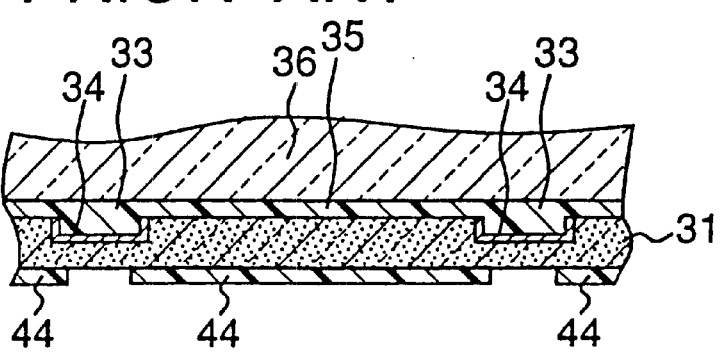
Figure 5E:
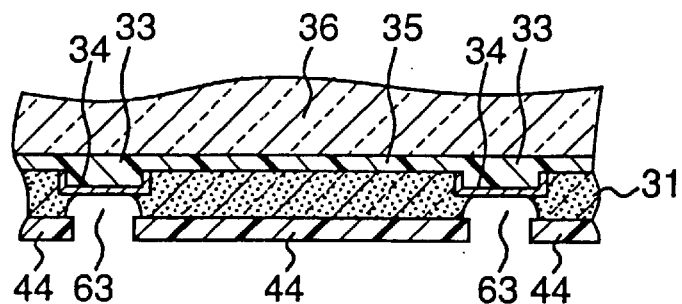
Figure 5F:
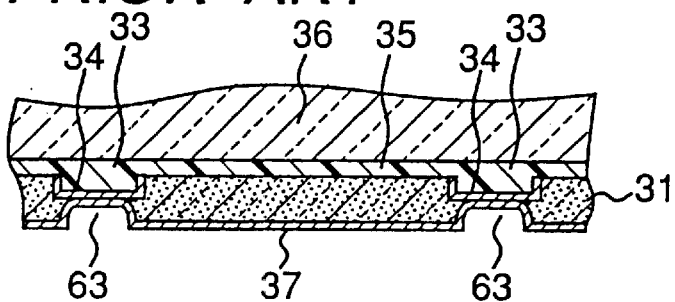
Figure 5G:
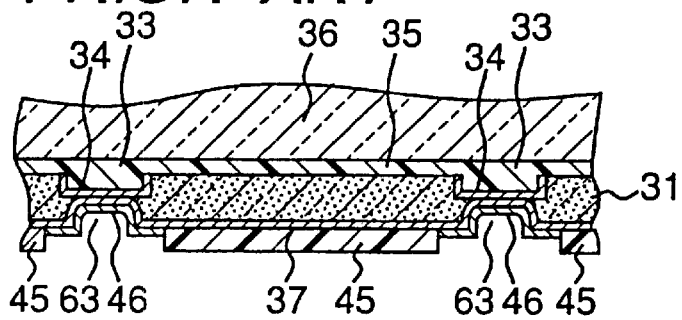
Figure 5H:
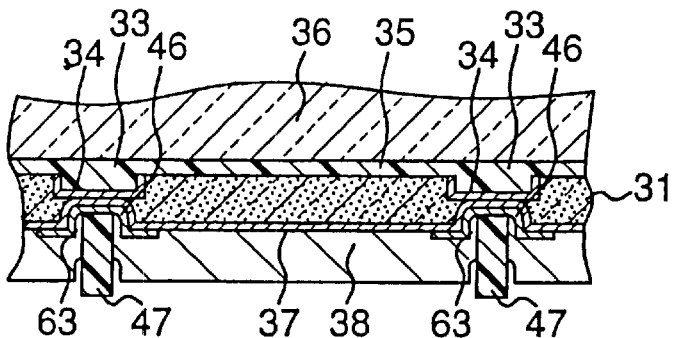
Figure 5I:
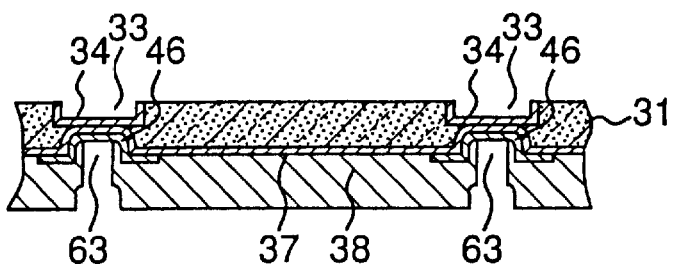
Figure 5J:
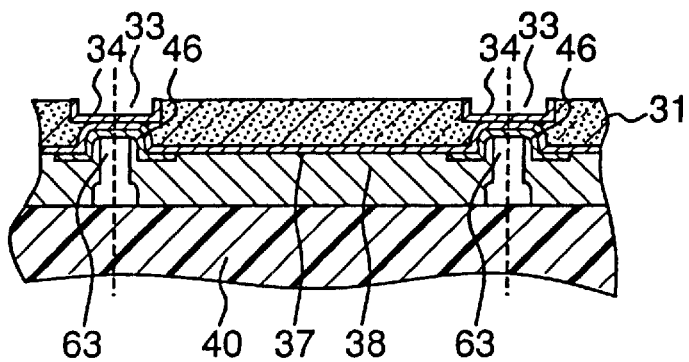
Figure 5K:
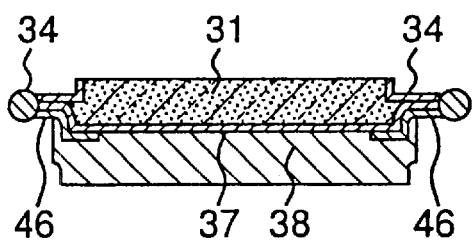
Figure 5L:
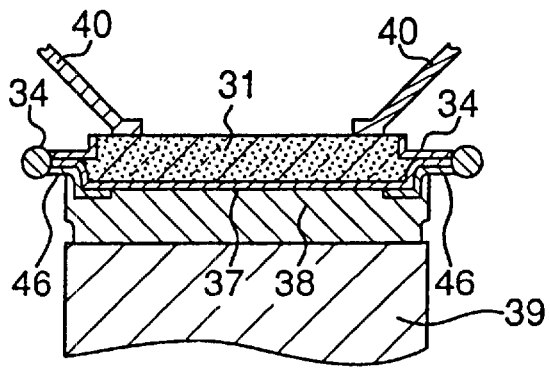

In the semiconductor device so manufactured, the topmost of the nickel based plating layer (metal layer) 4, running around the GaAs substrate 1, is positioned below the first main surface of the GaAs substrate 1. Therefore, when a bonding wire is bonded on the first main surface of the GaAs substrate 1 as shown in FIG. 5L, it is never short circuited to the nickel based plating layer 4, which increases the production yield of the semiconductor device.

As best shown in FIG. 4B, the semiconductor device so manufactured has a peripheral projecting flange running around the substrate 1. The flange includes a plurality of layers; the nickel based plating layer 4 (for example a Ni—P layer, Ni—B layer, a Ni—B—W layer), catalyst layer 3 (for example a Pd later, a Pd/Ti layer), nickel based electrolessly plated alloy layer (for example the Ni—P layer, Ni—B layer, Ni—B—W layer), substituted electroless gold plating layer, laser-cut metal layer 10 (for example a Ni layer, a Cr layer), gold layer or Ti/Au layer 11. It should be noted that the second conducting layer 9 has a nickel based electroless plating alloy layer and a substituted electrolessly gold plated layer. It should also be noted that the gold layer or the Ti/Au layer 11 may be eliminated as described above.

II. SECOND EMBODIMENT

Figure 3A:
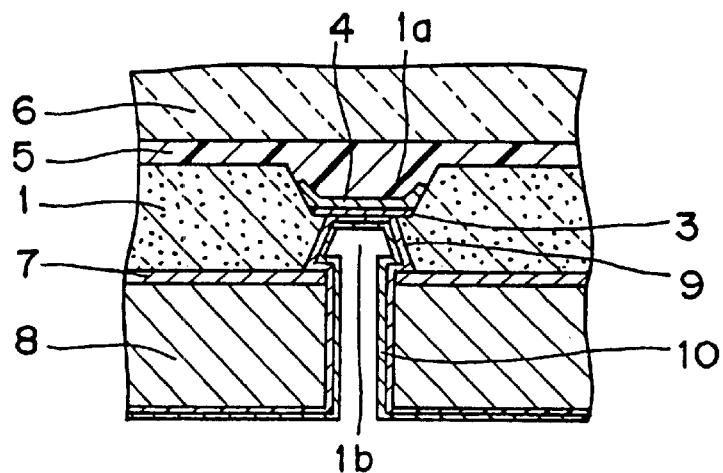
FIGS. 3A–3C show manufacturing processes for the semiconductor device according to the second embodiment of the present invention.

A second embodiment of the present invention will be described below with reference to FIG. 3A through FIG. 4. In this embodiment, processes described with reference to FIGS. 1A to 1I in connection with the first embodiment are performed, thereby obtaining an intermediate product shown in FIG. 3A. The intermediate product is processed, which will be described below.

Figure 3B:
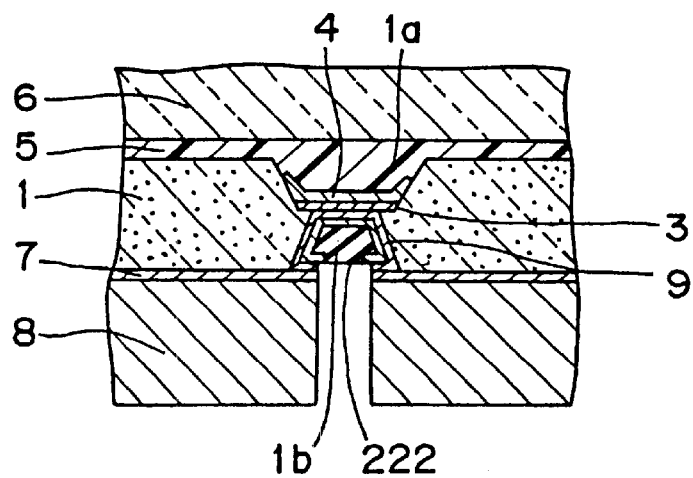
Figure 4:
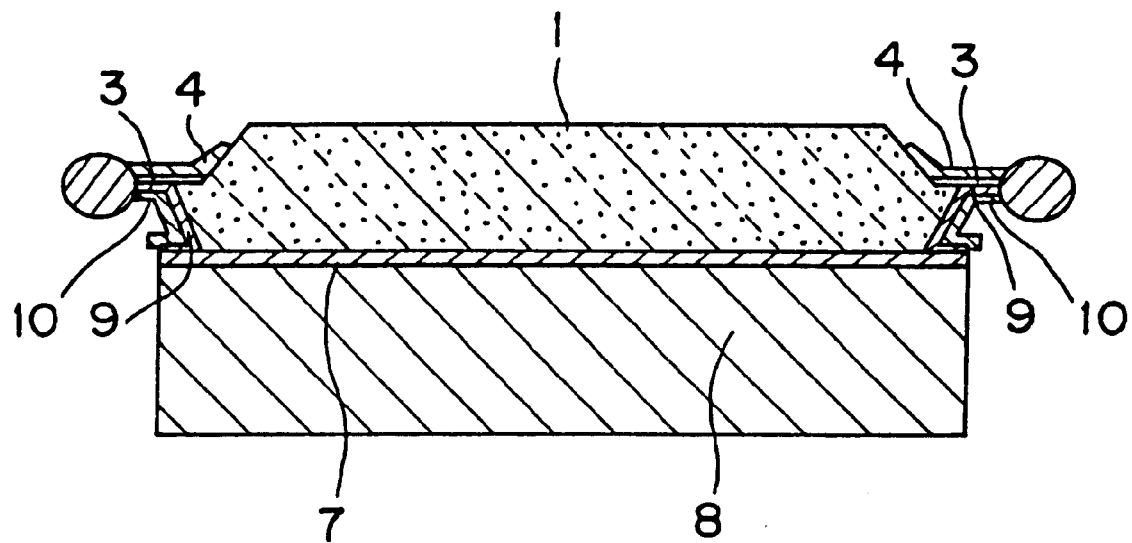
FIG. 4 shows a manufacturing process for the semiconductor device according to the second embodiment of the present invention.

Referring to FIG. 3B, the entire surface of metal layer 10 is coated with a positive photoresist layer which is then exposed and then developed so that only a part of the layer indicated at 222 remains in the second separation groove 1b. Then, a major part of the second conducting layer 9 and the metal layer 10 on the PHS layer 8 is removed by etching or milling, so that a minor part of the second conducting layer 9 and the laser-cut layer 10 still remains in the second separation groove 1b.

Figure 3C:
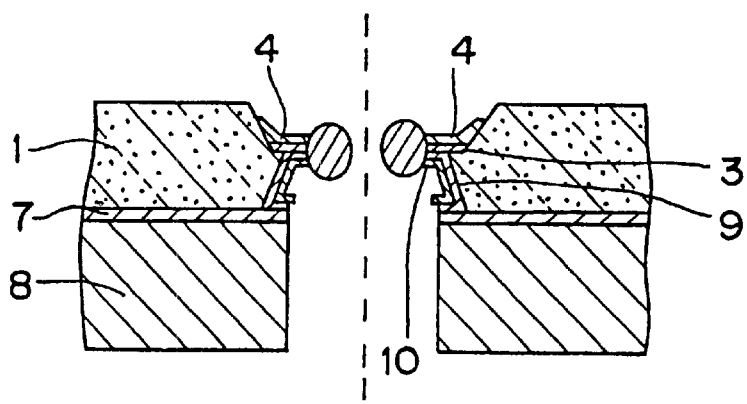

Finally, as shown in FIG. 3C, the remaining photoresist layer 222 is removed using an organic solvent or the like. Then, as described in the first embodiment, the YAG laser light is irradiated from above toward the first separation groove 1a to cut the nickel based plating layer 4, the catalyst layer 3, the second conducting layer 9, the laser-cut metal layer 10, and then the Ti/Au layer 11. In this way, the GaAs substrate 1 is separated into pieces, each of which forms an independent semiconductor element or device having the separated piece of the GaAs substrate 1. An example of the semiconductor element or device so manufactured is illustrated in FIG. 4.

Similar to the semiconductor device according to the first embodiment, the semiconductor device of this embodiment has a peripheral projecting flange running around the substrate 1. The flange includes a plurality of layers; a nickel based plating layer 4 (for example the Ni—P layer, Ni—B layer, Ni—B—W layer), a catalyst layer 3 (for example Pd later, Pd/Ti layer), a nickel based electroless plated alloy layer (for example Ni—P layer, Ni—B layer, Ni—B—W layer), a substituted electrolessly old plated layer, and then a laser-cut metal layer 10 (for example Ni layer, Cr layer). It should be noted that the second conducting layer 9 has a nickel based electrolessly plated alloy layer and a substituted electrolessly gold plated layer.

Although the present invention has been fully described with reference to the preferred embodiments in which the GaAs substrate 1 is employed, the present invention can also be applied equally to other semiconductor devices using substrates made of other materials such as Si, InP, and GaN.

What is claimed is:

1. A method of manufacturing a semiconductor device, including:

providing a substrate having first and second main surfaces and having a semiconductor element in the first main surface;

forming a first groove in the first main surface of the substrate, the first groove having a bottom surface with a width and opposing side surfaces at the bottom surface;

forming selectively a catalyst layer on the bottom surface of the first groove, the catalyst layer containing palladium in an upper surface;

forming a first metal layer of a nickel based plated layer on the upper surface of the catalyst layer by electroless plating, a top portion of the first metal layer being located below a top edge of the side surface of the first groove;

forming a second groove in the second main surface of the substrate along the first groove, the second groove having a bottom with a smaller width than that of the bottom of the first groove and opposing side surfaces at the bottom surface, the bottom surface of the second groove being a backside surface of the catalyst layer;

forming a second metal layer overlying the bottom and side surfaces of the second groove; and laser-cutting the first metal layer, the catalyst layer, and the second metal layer through the first groove.

2. The method for manufacturing a semiconductor device according to claim 1, comprising, after forming the first metal layer, attaching a supporting member on the first main surface, and thinning the substrate at the second main surface.

3. The method for manufacturing a semiconductor device according to claim 1, wherein forming the catalyst layer comprises:

forming a first photoresist layer on the first surface of the substrate, the photoresist layer having an opening opposing the first groove;

depositing a catalyst material on the bottom surface of the first groove, using the first photoresist layer as a masks by evaporation or sputtering; and removing the first photoresist layer together with the catalyst material on the photoresist layer, leaving the catalyst material on the bottom surface of the first groove.

4. The method for manufacturing a semiconductor device according to claim 1, wherein the catalyst layer has a palladium layer and a titanium layer under the palladium layer, or a single palladium layer.

5. The method for manufacturing a semiconductor device according to claim 1, wherein the nickel based plated layer is selected from Ni—P alloy, Ni—B alloy, and Ni—B—W alloy.

* * * * *